(12) United States Patent
Okumura (10) Patent No.: US 9,575,131 B2
(45) Date of Patent: Feb. 21, 2017

(54) RESIDUAL QUANTITY DISPLAY SYSTEM

(75) Inventor: Masafumi Okumura, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 713 days.

(21) Appl. No.: 13/361,045

(22) Filed: Jan. 30, 2012

(65) Prior Publication Data

US 2012/0185190 A1 Jul. 19, 2012

Related U.S. Application Data

(63) Continuation of application No. PCT/JP2009/063680, filed on Jul. 31, 2009.

(51) Int. Cl.
G01R 31/36 (2006.01)

(52) U.S. Cl.
CPC ....... *G01R 31/3651* (2013.01); *G01R 31/3624* (2013.01); *G01R 31/3658* (2013.01); *G01R 31/3662* (2013.01)

(58) Field of Classification Search
USPC .......................................................... 702/63
See application file for complete search history.

(56) References Cited

U.S. PATENT DOCUMENTS

| | | | | |
|---|---|---|---|---|
| 5,598,087 | A * | 1/1997 | Hara | 324/431 |
| 5,631,540 | A * | 5/1997 | Nguyen | 320/127 |
| 5,680,027 | A * | 10/1997 | Hiratsuka et al. | 320/106 |
| 5,936,383 | A * | 8/1999 | Ng et al. | 320/132 |
| 2002/0196026 | A1* | 12/2002 | Kimura et al. | 324/426 |
| 2006/0158151 | A1* | 7/2006 | Kimura | 320/106 |
| 2007/0052423 | A1* | 3/2007 | Arai | 324/429 |
| 2011/0241693 | A1* | 10/2011 | Kurata | 324/427 |

FOREIGN PATENT DOCUMENTS

| | | |
|---|---|---|
| JP | 11-272369 | 10/1999 |
| JP | 2001-282400 | 10/2001 |
| JP | 2002-170600 | 6/2002 |
| JP | 2003-157912 | 5/2003 |

OTHER PUBLICATIONS

International Preliminary Report on Patentability mailed Feb. 16, 2012 issued in corresponding International Patent Application No. PCT/JP2009/063680.
International Search Report mailed Nov. 2, 2009 in corresponding International Application No. PCT/JP2009/063680.

(Continued)

*Primary Examiner* — Paul D Lee
(74) *Attorney, Agent, or Firm* — Staas & Halsey LLP (57) ABSTRACT

A microcomputer in a device body operates so as to store every update of a maximum discharge current value ($I_{MAX}$ (A)) of a secondary battery (the whole plurality of cells), and operates so as to indicate the ratio value of the remaining capacity defined in a remaining capacity definition table with respect to a discharge voltage value (V (V)) of the secondary battery while reducing the ratio value in accordance with the maximum discharge current value ($I_{MAX}$ (A)) when obtaining the discharge voltage value (V (V)) from a protection circuit.

18 Claims, 6 Drawing Sheets

(56) References Cited

OTHER PUBLICATIONS

*5 Major Characteristics of Nickel-Metal Hydride Battery*, Matsushita Electric Industrial Co., Ltd., http://industrial.panasonic.com/www-data/pdf/ACG4000/ACG4000PJ2.pdf, Jun. 25, 2008, (12 pp.).
*Basic Information of Lithium-ion battery*, Baysun Co., Ltd., http://www.baysun.net/lithium/lithium10.html, Jun. 25, 2008 (4 pp.).
*Overview and Advantages of Lithium-ion battery*, Matsushita Electric Industrial Co., Ltd., http://industrial.panasonic.com/www-data/pdf/ACA4000/ACA4000PJ3.pdf, Jun. 25, 2008 (10 pp.).
International Search Report, mailed Nov. 2, 2009, in corresponding International Application No. PCT/JP2009/063680.

\* cited by examiner

33A: RESIDUAL QUANTITY DEFINITION TABLE

| RESIDUAL QUANTITY RATE VALUE | OPEN CIRCUIT VOLTAGE VALUE |
|---|---|
| 1.0 | 4.053V |
| 0.9 | 3.986V |
| 0.8 | 3.925V |
| 0.7 | 3.870V |
| 0.6 | 3.825V |
| 0.5 | 3.788V |
| 0.4 | 3.756V |
| 0.3 | 3.733V |
| 0.2 | 3.706V |
| 0.1 | 3.600V |
| 0.0 | 3.200V |

FIG. 6

RESIDUAL QUANTITY DISPLAY SYSTEM

CROSS-REFERENCE TO RELATED APPLICATIONS

This is a continuation of Application PCT/JP2009/063680, filed on Jul. 31, 2009, now pending, the contents of which are herein wholly incorporated by reference.

FIELD

The present disclosure relates to a method, a program and a device for displaying a residual quantity of a secondary battery such as a lithium ion battery and a nickel hydrogen battery.

BACKGROUND

As broadly known, an electronic device such as a notebook type personal computer PC and a PDA (Personal Digital Assistant) is contrived to be supplied with electric power from the secondary battery. A majority of this type of electronic devices displays the residual quantity of the secondary battery at a rate against a full capacity, and hence an operator can grasp the residual quantity of the secondary battery through the residual quantity rate.

Figure 6:
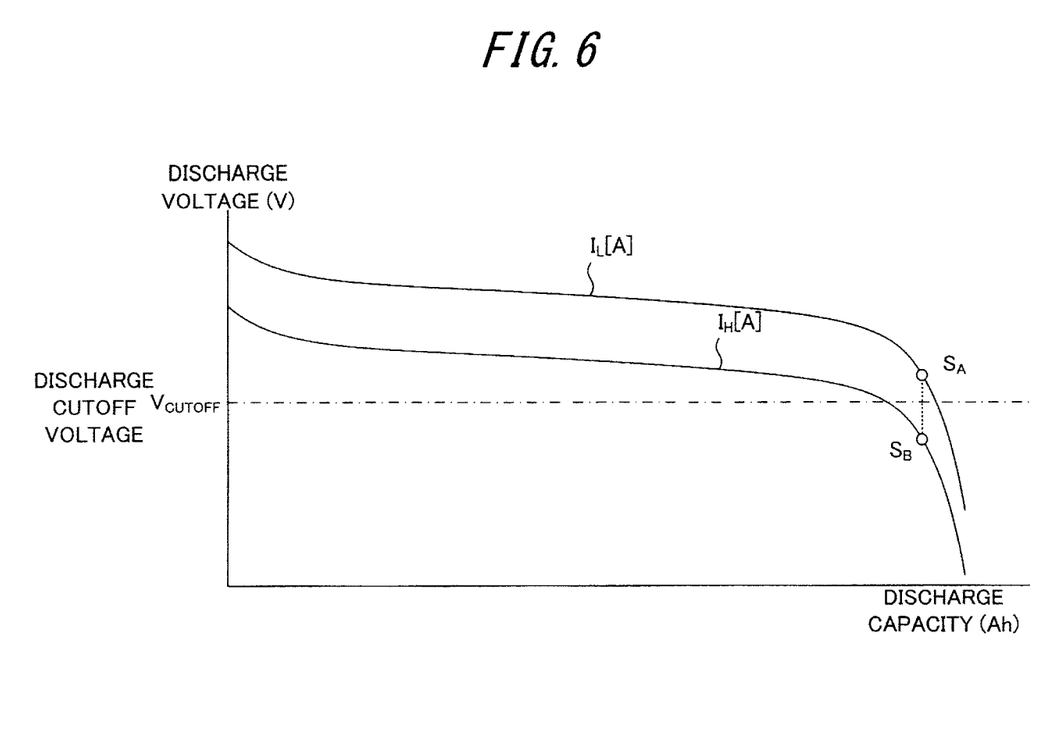
FIG. 6 is a diagram illustrating a graph representing a relationship between a discharge voltage and a discharge capacity.

The secondary battery, as disclosed in Non-Patent documents 1 through 3, has such a discharge characteristic that a discharge voltage decreases on a step-by-step basis as accumulated electric power is consumed in a state approximate to a full charge and in a low charge state and decreases sharply as the accumulated electric power is consumed in a state approximate to a full discharge. Further, as indicated by a graph representing a relationship between the discharge voltage and the discharge capacity in FIG. 6, the secondary battery also has a discharge characteristic that the discharge capacity and the discharge voltage become lower in a large current discharge state $I_H$ (A) than in a small current discharge state $I_L$ (A). This is because an internal resistance of the secondary battery is higher in the large current discharge state $I_H$ (A) than in the small current discharge state $I_L$ (A).

By the way, when the secondary battery excessively gets approximate to the full discharge, battery performance deteriorates to such an extent as to be disabled from recovering. Therefore, a discharge cutoff voltage value $V_{CUTOFF}$ (V) is determined as a limit to which given performance is kept in the secondary battery. A housing of the secondary battery is mounted with a protection circuit, which is contrived to monitor the discharge voltage value of the secondary battery and to, when the discharge voltage value becomes lower than the discharge cutoff voltage value $V_{CUTOFF}$ (V), stop discharging the electricity of the secondary battery (stops supplying the electric power to the device).

The residual quantity rate displayed by the electronic device described above is calculated based on a difference between the discharge voltage value and the discharge cutoff voltage value $V_{CUTOFF}$ (V). Hence, for example, in the small current discharge state $I_L$ (A), when the discharge voltage value slightly exceeds the discharge cutoff voltage value $V_{CUTOFF}$ V) (state $S_A$ in FIG. 6) and when the small current discharge state $I_L$ (A) continues as it is, a capacity remaining in the secondary battery can be used, and therefore the operator does not get confused even when the electronic device displays "Residual quantity still remains".

When the discharge current rises with an increase in demand for the electric power with the result that the large current discharge state $I_H$ (A) occurs, however, the discharge voltage value decreases under the discharge cutoff voltage value $V_{CUTOFF}$ (V) (state $S_B$ in FIG. 6), and the protection circuit stops discharging, resulting in disabling the capacity remaining in the secondary battery from being used. At this time, the electronic device displays "Residual quantity still remains", and nevertheless, since the supply of the electric power is abruptly stopped as the demand for the electric power rises, it follows that the operator gets confused.

Thus, the discharge cutoff voltage value $V_{CUTOFF}$ (V) is used as a threshold value, in which case it might happen that the residual quantity of the secondary battery is not properly displayed.

Further, Patent document 1 discloses that whether there is the residual quantity of the battery capacity is determined depending on whether a quantity of electric current consumption of the electronic device reaches a maximum capacity $C_{MAX}$ (Ah) that is predetermined with respect to the secondary battery. In this Patent document 1, the quantity of electric current consumption of the electronic device is obtained by taking a total sum of the quantities of electric current consumption of the respective units within the device. Further, the quantities of electric current consumption of the respective units are calculated by recording the current values when operating and when standing by as required and integrating the current values at the respective points of time. Moreover, in this Patent document 1, the maximum capacity $C_{MAX}$ (Ah) of the secondary battery is a capacity measured by actually discharging the electricity of the secondary battery.

The maximum capacity $C_{MAX}$ (Ah) predetermined with respect to the secondary battery, however, differs depending on whether the measurement is done in the large current discharge state $I_H$(A) or in the small current discharge state $I_L$(A). Therefore, for instance, the maximum capacity $C_{MAX}$ (Ah) is measured in the large current discharge state $I_H$ (A), in which case a capacity smaller than the capacity actually remaining in the secondary battery is displayed as the residual quantity when the quantity of the electric current consumption of the electronic device is a quantity accumulated in the small current discharge state $I_L$(A), and it follows that the quantity of the electric current consumption reaches the maximum capacity $C_{MAX}$ (Ah) and the supply of the electric power is thereby stopped irrespective of the usable residual quantity being left in the secondary battery. Further, e.g., in the case where the maximum capacity is the capacity measured in the small current discharge state $I_L$(A), when the quantity of the electric current consumption of the electronic device is the quantity accumulated mainly in the large current discharge state $I_H$ (A) the capacity larger than the capacity, which is actually left in the secondary battery, is displayed as the residual quantity, and "Residual quantity still remains" might be displayed even when the discharge voltage is under the discharge cutoff voltage value $V_{CUTOFF}$.

Thus, even in the case of using the maximum capacity $C_{MAX}$ (Ah) as the threshold value, the residual quantity of the secondary battery is not properly displayed as the case may be.

DOCUMENT OF PRIOR ART

Non-Patent Document

[Non-Patent document 1] "Five Major Characteristics of Nickel Hydrogen Battery", (online), Matsushita Electric Industrial Co., Ltd., (searched on Jun. 25, 2008), Internet<http://industrial.panasonic.com/www-data/pdf/ACG 4000/ACG4000PJ2.pdf>

[Non-Patent document 2] "Outline/Characteristics of Lithium Ion Battery" (online), Matsushita Electric Industrial Co., Ltd., (searched on Jun. 25, 2008), Internet<http://industrial.panasonic.com/www-data/pdf/ACA 4000/ACA4000PJ3.pdf>

[Non-Patent document 3] "Basic 10 of Lithium Ion Battery: Way of Observing Discharge Characteristic Curves" (online), BAYSUN Co., Ltd., (searched on Jun. 25, 2008), Internet<http://www.baysun.net/lithium/lithium10.html>

Patent Document

[Patent document 1] Japanese Patent Application Laid-Open Publication No. H11-272369 (Paragraphs 0021, 0029)

[Patent document 2] Japanese Patent Application Laid-Open Publication No. 2001-282400

SUMMARY

An aspect of a residual quantity display method is illustrated as follows.

Namely, a computer executes: a first acquiring procedure of acquiring a discharge current value of a secondary battery; a storing procedure of storing, when the discharge current value acquired in the first acquiring procedure is a maximum discharge current value in a discharge process of the secondary battery, this maximum discharge current value; a second acquiring procedure of acquiring a discharge voltage value of the secondary battery; a reading procedure of reading a residual quantity rate value associated with an open circuit voltage value that is arithmetically obtained from the discharge voltage value acquired in the second acquiring procedure, the discharge current value acquired in the first acquiring procedure and a predetermined internal resistance value of the secondary battery out of a table in which to define an open circuit voltage value at a residual quantity rate value with respect to each of a plurality of residual quantity rate values at which the residual quantities against a full capacity of the secondary battery are given at intervals of a predetermined value; a correcting procedure of correcting the residual quantity rate value read in the reading procedure in a way that reduces the residual quantity rate value corresponding to the maximum discharge current value stored in the storing procedure; and a display procedure of displaying the residual quantity rate value corrected in the correcting procedure.

It is to be noted that the operation of the computer according to the residual quantity display method described above can be realized also by a residual quantity display program or a residual quantity display device. Namely, the present disclosure may be the residual quantity display program which makes the computer function as a plurality of unit functioning equally to the respective procedures executed by the computer based on the residual quantity display method described above and may also be the residual quantity display device including the unit equal to these respective procedures Further, the present disclosure may also be a non-transitory computer-readable medium, stored with the residual quantity display program described above.

The object and advantage of the embodiment will be realized and attained by means of the elements and combinations particularly pointed out in the claims.

It is to be understood that both the foregoing general description and the following detailed description are exemplary and explanatory only and are not restrictive of the invention, as claimed.

DESCRIPTION OF EMBODIMENTS

A notebook type personal computer will hereinafter be described by way of an embodiment of the present disclosure with reference to the accompanying drawings.

It is to be noted that the notebook type personal computer of the present embodiment, which will hereinafter be explained, is exemplified just as one embodiment and may also be, when being an electronic device attached in an attachable/detachable manner with a secondary battery such as a lithium ion battery and a nickel hydrogen battery and thereby enabled to accumulate and extract electric power, an electronic device other than the notebook type personal computer. The electronic device other than the notebook type personal computer is exemplified such as a PDA (Personal Digital Assistant), a mobile phone, a digital still camera, a digital video camera, a mobile music reproducer, a mobile video reproducer and a mobile game machine.

<<Configuration>>

Figure 1:
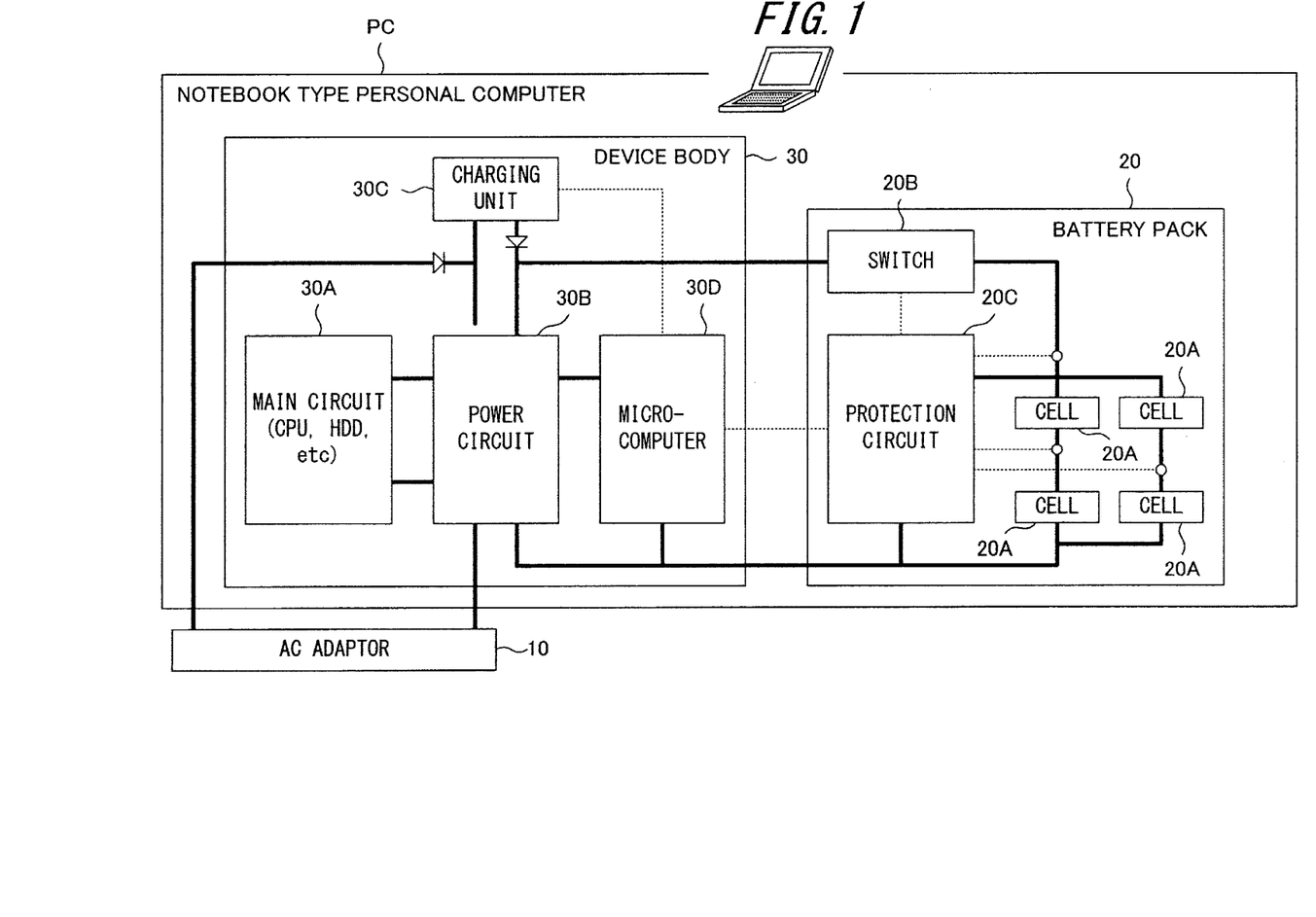
FIG. 1 is a diagram of a configuration of a notebook type personal computer of the present embodiment.

FIG. 1 is a diagram of a configuration of a notebook type personal computer PC in the present embodiment.

The notebook type personal computer PC in the embodiment includes an AC adaptor 10, a battery pack 20 and a device body 30.

The AC adaptor 10 is a component connected to a socket (wall socket) with which an ordinary house is equipped and to the device body 30, thereby supplying the device body 30 with DC power converted from AC power.

The battery pack 20 is a component used for the device body 30 to accumulate and extract the electric power. The battery pack 20 includes a plurality of cells 20a, a switch 20b and a protection circuit 20c. Each of the plural cells 20a has a pair of electrode and electrolyte as a minimum unit for realizing a battery function. In the embodiment, the battery pack 20 includes the four cells 20a which are connected in two rows in parallel and in two columns in series. Note that the number of the cells 20a may be, without being limited to "4", equal to or larger than "5" and may also be equal to or smaller than "3" in terms of carrying out the present disclosure. Further, in terms of carrying out the present disclosure, the cells 20a may take only the in-series connections or only the parallel connections as a connection mode thereof. The connection mode depicted in FIG. 1 is given just as one embodiment. The switch 20b is a circuit for letting electricity through and cutting off the electricity between a positive terminal functioning as an input terminal when charged with the electricity and functioning as an output terminal when discharging the electricity and a positive electrode of the secondary battery built up by the whole of plural cells 20a. The protection circuit 20c is a circuit for cutting off the electricity between the secondary battery (the whole of plural cells 20a) and the positive terminal with respect to the switch 20b when a predetermined condition is satisfied. Note that the predetermined condition is exemplified such as, specifically, a discharge cutoff voltage value $V_{CUTOFF}$ (V) defined as a lower limit value of the discharge voltage of the secondary battery, an upper limit value of a charging current of the secondary battery, and upper and lower limit values of a temperature range. Accordingly, the protection circuit 20c includes unit which measure, the voltage, the current and the temperature of the secondary battery. A white circle depicted in FIG. 1 represents a voltage sensor as the voltage measuring unit.

The device body 30 includes a main circuit 30a as hardware (e.g., a CPU (Central Processing Unit), a main memory, a HDD (Hard Disk Drive), a communication adaptor) for realizing functions of the notebook type personal computer PC, and also includes a power circuit 30b, a charging circuit 30c and a microcomputer (which will hereinafter be abbreviated to MC) 30d as hardware for managing the electric power supplied to the main circuit 30a. For example, the main circuit 30a becomes a load which operates by dint of the electric power supplied from the battery pack 20. The power circuit 30b is a circuit for stepping down the DC power that is output from the positive electrode of the AC adaptor 10 or the DC power that is output from the positive electrode of the battery pack 20 and thus supplying the step-down DC power to the main circuit 30a and the MC 30d. The charging circuit 30c is a circuit which, upon receiving an instruction from the MC 30d, steps down the DC power that is output from the positive electrode of the AC adaptor 10 and thus supplies the step-down DC power to the positive terminal of the battery pack 20. The MC 30d is a circuit for managing the charge and the discharge with respect to the battery pack 20.

Figure 2:
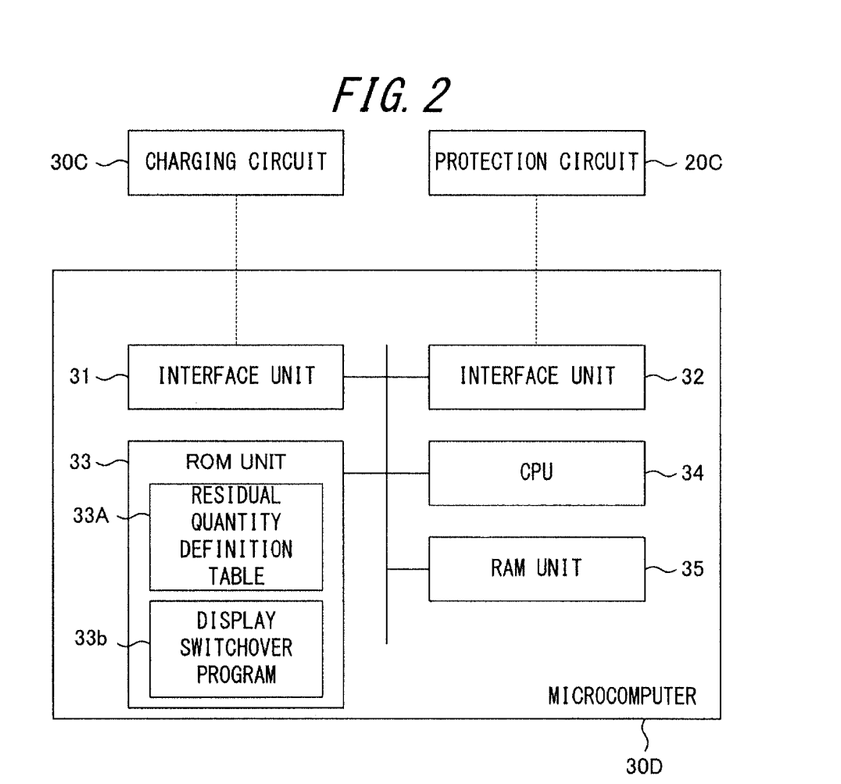
FIG. 2 is a diagram of a configuration of a microcomputer.

FIG. 2 is a diagram of a configuration of the MC 30d.

Figure 3:
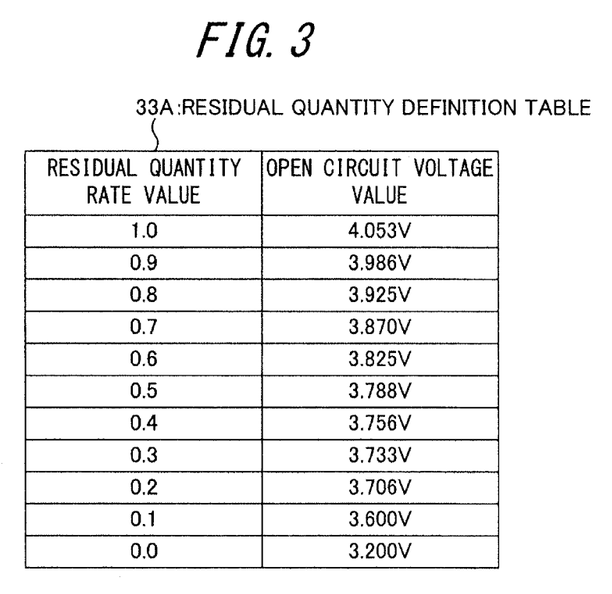
FIG. 3 is a diagram schematically illustrating a residual quantity definition table.

The MC 30d includes first and second interface units 31, 32, a ROM (Read Only Memory) unit 33, a CPU 34 and a RAM (Random Access Memory) unit 35. The first interface unit 31 is a unit for transmitting a control signal to the charging circuit 30c. The second interface unit 32 is a unit for transferring and receiving the data to and from the protection circuit 20c of the battery pack 20 in accordance with a predetermined communication protocol. The predetermined communication protocol is exemplified such as I²C-bus (Inter-Integrated Circuit bus) and SM-Bus (System Management Bus). The ROM unit 33 is a unit recorded with a variety of programs and data. The MC 30d stores, in addition to a program (unillustrated) for controlling the charge, a residual quantity definition table 33a and a display switchover program 33b on the ROM unit 33. The residual quantity definition table 33a is a table in which to define, as illustrated in FIG. 3, an open circuit voltage value (open voltage value) at a residual quantity rate value with respect to a plurality of residual quantity rate values at which the residual quantities against a full capacity of the secondary battery (the whole of plural cells 20a) are scored up from 1.0 down to 0.0 at intervals of 0.1. Note that each of the open circuit voltage values $V_{OC}$ defined in the residual quantity definition table 33a illustrated in FIG. 3 is the voltage value obtained when the secondary battery, of which an internal resistance value Z is set to 0.10(Ω) and the discharge cutoff voltage value V CUTOFF is set to 3.00 (V), is discharged at 2.00(A), however, in terms of carrying out the present disclosure, the open circuit voltage value defined in the residual quantity definition table 33a is not a measured value but may be a theoretical value. The display switchover program 33b is a program for updating a value, which is to be displayed after correcting the residual quantity rate of the secondary battery that is obtained from the residual quantity definition table 33a. Contents of processes executed by the CPU 34 according to this display switchover program 33b, will be described later on by use of FIG. 4.

<<Process>>

In the MC 30d of the present embodiment, when in a status of not charging the secondary battery with the electricity, the CPU 34 periodically (e.g., at intervals of 15 min) reads the display switchover program 33b from the ROM unit 33 and executes the display switchover program 33b.

Figure 4:
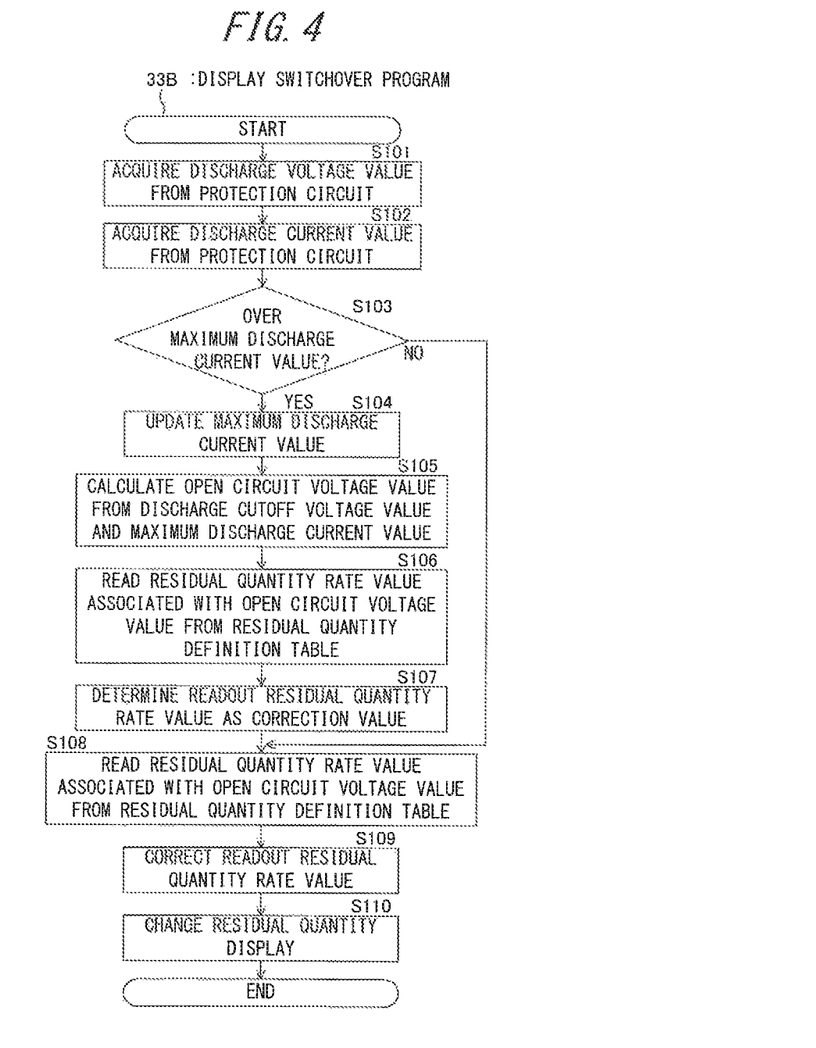
FIG. 4 is a diagram illustrating a flow of a display switchover process executed by a CPU according to a display switchover program.

FIG. 4 is a diagram illustrating a flow of the display switchover process executed by the CPU 34 according to the display switchover program 33b.

After starting the display switchover process, in first step S101, the CPU 34 acquires the discharge voltage value V (V) of the secondary battery (the whole of plural cells 20a) from the protection circuit 20c within the battery pack 20.

It is to be noted that step S101 corresponds to the second acquiring procedure described above.

In next step S102, the CPU 34 acquires a discharge current value I (A) of the secondary battery (the whole of plural cells 20a) from the protection circuit 20c within the battery pack 20.

It is to be noted that step S102 corresponds to the first acquiring procedure described above.

In next step S103, the CPU 34 determines whether or not the discharge current value I (A) acquired in step S102 exceeds a maximum discharge current value $I_{MAX}$ (A) recorded in a predetermined storage area of the RAM unit 35. Note that in the embodiment, the maximum discharge current value $I_{MAX}$ (A) is deleted from the predetermined storage area of the RAM unit 35 when the battery pack 20 is detached from the notebook type personal computer PC, and an initial value (e.g., 0 (A)) is recorded in the predetermined storage area of the RAM unit 35 when the battery pack 20 is attached to the notebook type personal computer PC. Then, when the discharge current value I (A) acquired in step S102 does not exceed the maximum discharge current value $I_{MAX}$ (A) recorded in the predetermined storage area of the RAM unit 35, the CPU 34 branches the processing to step S108 from step S103. Whereas when the discharge current value I (A) acquired in step S102 exceeds the maximum discharge current value $I_{MAX}$ (A) recorded in the predetermined storage area of the RAM unit 35, the CPU 34 advances the processing to step S104 from step S103.

In step S104, the CPU 34 overwrites the maximum discharge current value $I_{MAX}$ (A) recorded in the predetermined storage area of the RAM unit 35 with the discharge current value I (A) acquired in step S102, thereby updating the maximum discharge current value $I_{MAX}$(A) within the predetermined storage area.

It is to be noted that steps S103 and S104 correspond to the storing procedure described above.

In next step S105, the CPU 34 calculates the open circuit voltage value $V_{OC}$(V) on the basis of the discharge cutoff voltage value $V_{CUTOFF}$ (V) used by the protection circuit 20c of the battery pack 20 and the maximum discharge current value $I_{MAX}$(A) within the predetermined storage area of the RAM unit 35. To be specific, the CPU 34, at first, acquires the internal resistance value Z (Ω) of the secondary battery (the whole of plural cells 20a) and the discharge cutoff voltage value $V_{CUTOFF}$ (V) from the protection circuit 20c. Subsequently, the CPU 34 adds the discharge cutoff voltage value $V_{CUTOFF}$ (V) to a value obtained by multiplying the maximum discharge current value $I_{MAX}$(A) within the predetermined storage area of the RAM unit 35 by the internal resistance value Z(Ω), thereby calculating the open circuit voltage value $V_{OC}$(V) ($V_{OC}=I_{MAX} \times Z+V_{CUTOFF}$).

In next step S106, the CPU 34 reads the residual quantity rate value associated with the open circuit voltage value $V_{OC}$(V) calculated in step S105 from the residual quantity definition table 33a in FIG. 3.

In next step S107, the CPU 34 determines, as a correction value, the residual quantity rate value read in step S106. Specifically, the CPU 34 overwrites the correction value recorded in the predetermined storage area of the RAM unit 35 with the residual quantity rate value read in step S106, thereby updating the correction value within the predetermined storage area. Note that similarly to the maximum discharge current value $I_{MAX}$(A), the correction value is deleted from the predetermined storage area of the RAM unit 35 when detaching the battery pack 20, and the initial value (e.g., "0.0") is recorded in the predetermined storage area of the RAM unit 35 when attaching the battery pack 20. The CPU 34, upon determining the correction value, advances the processing to step S108.

In step S108, the CPU 34 reads the residual quantity rate value associated with the open circuit voltage value calculated based on the discharge voltage V (V) acquired in step S101 from the residual quantity definition table 33a in FIG. 3.

It is to be noted that step S108 corresponds to the reading procedure described above.

In next step S109, the CPU 34 corrects the residual quantity rate value that is read in step S108 on the basis of the correction value in the predetermined storage area of the RAM unit 35. To be specific, the CPU 34, to begin with, subtracts the correction value in the predetermined storage area of the RAM unit 35 from the residual quantity rate value read in step S108. Subsequently, the CPU 34 multiplies the value obtained by the subtraction thereof by an inverse number of the value obtained by subtracting the correction value in the predetermined storage area of the RAM unit 35 from "1". The CPU 34 acquires the value obtained by this subtraction as a value into which the residual quantity rate value read in step S108 is corrected.

It is to be noted that step S109 corresponds to the correcting procedure described above.

In next step S110, the CPU 34 updates the display of the residual quantity of the secondary battery in the notebook type personal computer PC on the basis of the residual quantity rate value that is corrected in step S109. For example, the CPU 34 updates a register recorded with the residual quantity rate value used for the notebook type personal computer PC to display the residual quantity of the secondary battery with the residual quantity rate value corrected in step S109. Alternatively, the CPU 34 executes a process of instructing a liquid crystal display device (unillustrated) on which to display the residual quantity rate of the secondary battery in terms of a percentages bar graph so as to display the residual quantity rate value corrected in step S109. Thereafter, the CPU 34 terminates the display switchover process pertaining to FIG. 4. It is to be noted that step S110 corresponds to the display procedure described above.

<<Operational Effect>>

In the embodiment, the internal resistance value Z of the secondary battery (the whole of plural cells 20a) is 0.10 (Ω), and the discharge cutoff voltage value $V_{CUTOFF}$ is 3.00 (V), in which case when the maximum discharge current value $I_{MAX}$ in a discharge process from when the battery pack is attached to the notebook type personal computer PC is 2.00 (A), the open circuit voltage value $V_{OC}$ becomes 3.20 (V), which is given by 2.00×0.10+3.00=3.20 (V) (step S105). Therefore, when referring to the residual quantity definition table 33a in FIG. 3, the residual quantity rate value associated with 3.20 (V) turns out to be 0.0, and it follows that the correction value becomes 0.0 (steps S106, S107). Accordingly, when the maximum discharge current value $I_{MAX}$ of the secondary battery does not exceed 2.00 (A), as defined in the residual quantity definition table 33a in FIG. 3, 0.5 (50%) is indicated in the residual quantity display when the open circuit voltage value $V_{OC}$ of the secondary battery is 3.79 (V), and, because of the value (residual quantity rate value) being an intermediate value between 3.600 (V) and 3.200 (V) when the open circuit voltage value $V_{OC}$ is 3.400 (V), it follows that 0.05 (5%) is indicated in the residual quantity display (steps S108-S110).

Figure 5:
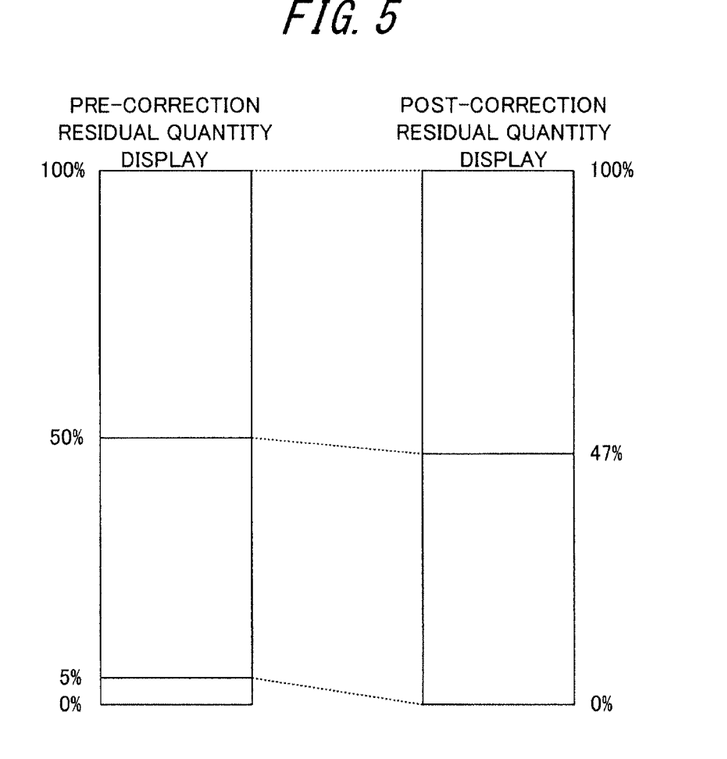
FIG. 5 is a diagram illustrating a relationship between a pre-correction residual quantity rate and a post-correction residual quantity rate of the secondary battery.

Further, when the maximum discharge current value $I_{MAX}$ in the discharge process from when the battery pack is attached to the notebook type personal computer PC is 4.0 (A), the discharge cutoff voltage value $V_{CUTOFF}$ becomes 3.4 (V), which is given by 4.0×0.1+3.0=3.4 (V). Therefore, when referring to the residual quantity definition table 33a in FIG. 3, the residual quantity rate value associated with 3.40 (V) turns out to be 0.05 due to an intermediate value between 3.600 (V) and 3.200 (V) in the residual quantity definition table 33a, and it follows that the correction value becomes 0.05 (steps S106, S107). Namely, in the secondary battery, when a full charge state of the secondary battery is set at 100%, it follows that 5% of the electricity can not be used, while only a difference, i.e., 95% can be employed. Accordingly, when the maximum discharge current value $I_{MAX}$ of the secondary battery is 4.0 (A) and when the open circuit voltage value $V_{OC}$ of the secondary battery is 3.79 (V), the residual quantity display, as illustrated in FIG. 5, indicates not 0.5 (50%) but 0.47 (47%), which is given by (0.5−0.05)×100 (100−5)=0.45×100÷95≈0.47 (47%). Further, when the open circuit voltage value $V_{OC}$ of the secondary battery is 3.40 (V), the residual quantity display, as illustrated in FIG. 5, indicates not 0.05 (5%) but 0.0 (0%), which is given by (0.05−0.05)×100≧(100−5)=0.0 (0%) (steps S108-S110).

Thus, according to the embodiment, the MC 30d operates to, each time the maximum discharge current value $I_{MAX}$(A) of the secondary battery (the whole of plural cells 20a) is updated, store this updated current value, and also operates to, when acquiring the discharge voltage value V (V) of the secondary battery from the protection circuit 20c, display the residual quantity rate value defined in the residual quantity definition table 33a in FIG. 3 with respect to the open circuit voltage value calculated based on the acquired discharge voltage value V (V) in a way that reduces this residual quantity rate value corresponding to the maximum discharge current value $I_{MAX}$ (A). Accordingly, the smaller residual quantity rate value is displayed as the maximum discharge current value $I_{MAX}$(A) becomes higher. That is to say, it follows that the residual quantity rate value is displayed so as to be reduced comparatively fast with consumption of the accumulated electric power in the case of using the secondary battery in such a large current discharge state that the maximum discharge current value $I_{MAX}$ becomes 4.0 (A) and is displayed so as to be comparatively slow with the consumption of the accumulated electric power in the case of using the secondary battery in such a small current discharge state that the maximum discharge current value $I_{MAX}$ becomes 2.0 (A). As a result, the residual quantity of the secondary battery is displayed more properly than hitherto done.

<<Descriptions about Units>>

In the embodiment discussed above, the respective units 31-35 in the MC 30d may each have a configuration including software components and hardware components and may also have a configuration including only the hardware components.

The software components can be exemplified such as an interface program, a driver program, a table and data, and, in addition, a combination of some of these components. These software components may be stored on a non-transitory computer-readable medium that will be explained later on and may also be firmware that is fixedly incorporated into a storage device such as a ROM (Read Only Memory) and an LSI (Large Scale Integration).

Moreover, the hardware components can be exemplified by an FPGA (Field Programmable Gate Array), an ASIC (Application Specific Integrated Circuit), a gate array, a combination of logic gates, a signal processing circuit, an analog circuit and other types of circuits. Among these components, the logic gate may include an AND, an OR, a NOT, a NAND, a NOR, a flip-flop, a counter circuit and so on. Further, the signal processing circuit may include circuit elements which execute addition, multiplication, subtraction, inversion, a sum-of-products operation, differentiation and integration of signal values. Still further, the analog circuit may include circuit elements which execute amplification, addition, multiplication, differentiation, integration, etc.

Note that the components building up the units 31-35 within the MC 30d described above may be, without being limited to those exemplified above, other components equivalent thereto.

<<Explanation about Software and Program>>

In the embodiment discussed above, the residual quantity definition table 33a and the display switchover program 33b within the MC 30d and, in addition, the above-described software components may each include a software component, a component based on a procedure-oriented language, an object-oriented software component, a class component, a component managed as a task, a component managed as a process, and elements such as a function, an attribute, a procedure (Procedure), a subroutine (software routine), a fragment or segment of a program code, a driver, firmware, a microcode, a code, a code segment, an extra segment, a stack segment, a program area, a data area, data, a database, a data structure, a field, a record, a table, a matrix table, an array, a variable and a parameter.

Furthermore, the residual quantity definition table 33a and the display switchover program 33b within the MC 30d and, in addition, the above-described software components may each be what is described in a C language, C++, Java (trademark of Sun Microsystems in U.S.A.), Visualbasic (trademark of Microsoft Corp. in U.S.A.), Perl, Ruby and other programming languages.

Moreover, the instruction, the code and the data contained in the residual quantity definition table 33a and the display switchover program 33b within the MC 30d and, in addition, the above-described software components, may be transmitted to or loaded into a computer or a computer incorporated into a machine or equipment via a wired network card and a wired network or via a wireless card and a wireless network.

In the transmission or loading described above, the data signals propagate across on the wired network or the wireless network in the way of their being carried on, e.g., carrier waves. The data signals may also be, however, transferred intact as so-called baseband signals without depending on the carrier waves described above. These carrier waves are transmitted in an electric, magnetic or electromagnetic mode, an optical mode, an acoustic mode or other modes.

Herein, the wired network or the wireless network is a network built up by, e.g., a telephone line, a network line, a cable (including an optical cable and a metallic cable), a wireless link, a mobile phone access line, a PHS (Personal Handyphone System) network, a wireless LAN (Local Area Network), Bluetooth (trademark of the Bluetooth Special Interest Group), on-vehicle wireless type communications (including DSRC (Dedicated Short Range Communication)) and a network having a configuration including any one of those given above. Then, the data signals carry the information including the instruction, the code and the data to a node or the component on the network.

Note that the components configuring the residual quantity definition table 33a and the display switchover program 33b within the MC 30d and, in addition, the above-described software components, are not limited to those exemplified above and may also be other components equivalent thereto.

<<Explanation about Non-Transitory Computer-Readable Medium>>

Any one of the functions in the embodiment discussed above may be coded and thus stored in a storage area on the non-transitory computer-readable medium. In this case, the program for realizing the function can be provided to the computer or the computer incorporated into the machine or the equipment via the non-transitory computer-readable medium. The computer or the computer incorporated into the machine or the equipment reads the program from the storage area on the non-transitory computer-readable medium and executes the program, thereby enabling the function thereof to be realized.

Herein, the non-transitory computer-readable medium connotes a recording medium capable of accumulating information such as the program and the data by electrical, magnetic, optical, chemical, physical or mechanical action, and retaining the information in a computer-readable status.

The electrical or magnetic action can be exemplified by writing the data to the element on the ROM [Read Only Memory] constructed by use of a fuse. The magnetic or physical action can be exemplified by a phenomenon of toners to form a latent image on a paper medium. Note that the information recorded on the paper medium can be read, e.g., optically. The optical and chemical action can be exemplified by forming a thin film or a rugged portion (lands and pits) on a substrate. Incidentally, the information recorded in the ruggedness-utilized mode can be read, e.g., optically. The chemical action can be exemplified by oxidation-reduction reaction on the substrate or forming an oxide film or a nitride film on a semiconductor substrate, or a photo-resist phenomenon. The physical or mechanical action can be exemplified by forming a rugged portion on an emboss card or forming a punch-hole in the paper medium.

Moreover, in the non-transitory computer-readable mediums, some mediums can be detachably attached to the computer or the computer incorporated into the machine or the equipment. The attachable/detachable non-transitory computer-readable medium can be exemplified by a DVD (including DVD-R, DVD-RW, DVD-ROM, DVD-RAM), a +R/+WR, a BD (including BD-R, BD-RE, BD-ROM), a CD (Compact Disk) (including CD-R, CD-RW, CD-ROM), an MO (Magneto Optical) disk, other optical disk mediums, a flexible disk (including a floppy disk (Floppy is a trademark of Hitachi Ltd.)), other magnetic disk mediums, a memory card (CompactFlash (trademark of SanDisk Corp. in U.S.A.)), SmartMedia (trademark of Toshiba Co., Ltd.), SD card (trademark of SanDisk Corp. in U.S.A., Matsushita Electric Industrial Co., Ltd. and Toshiba Co., Ltd.), Memory Stick (trademark of Sony Corp.), MMC (trademark of Siemens in U.S.A. and SanDisk Corp. in U.S.A.) etc), a magnetic tape and other tape mediums, and a storage device including, as a built-in component, any one of those mediums. Some of the storage devices have a built-in DRAM (Dynamic Random Access Memory) or SRAM (Static Random Access Memory).

Furthermore, some of the non-transitory computer-readable mediums are fixedly installed in the computer or the computer incorporated into the machine or the equipment. This type of non-transitory computer-readable medium can be exemplified by a hard disk, a DRAM, an SRAM, a ROM, an EEPROM (Electronically Erasable and Programmable Read Only Memory) and a flash memory.

All example and conditional language recited herein are intended for pedagogical purposes to aid the reader in understanding the invention and the concepts contributed by the inventor to furthering the art, and are to be construed as being without limitation to such specifically recited examples and conditions, nor does the organization of such example in the specification relate to a showing of the superiority and inferiority of the invention. Although the embodiment(s) of the present invention(s) has (have) been described in detail, it should be understood that the various changes, substitutions, and alterations could be made hereto without departing from the spirit and scope of the invention.

What is claimed is:

1. A non-transitory computer readable recording medium recorded with a residual quantity display program to make a hardware processor:
    store an initial value of a maximum discharge current value in a storage when a secondary battery is attached;
    acquire a discharge current value of the secondary battery using a current sensor;
    determine whether the discharge current value exceeds the initial value of the maximum discharge current value;
    overwrite the initial value of the maximum discharge current value stored in the storage with the discharge current value when the discharge current value exceeds the maximum discharge current value in a discharge process of the secondary battery, wherein the maximum discharge current value stored in the storage is a maximum discharge current value in a discharge process from when the secondary battery is attached;
    acquire a discharge voltage value of the secondary battery using a voltage sensor;
    read a residual quantity rate value associated with an open circuit voltage value, wherein the open circuit voltage value is arithmetically obtained from the discharge voltage value, the discharge current value, and a predetermined internal resistance value of the secondary battery, and wherein the residual quantity rate value is read out of a table that defines an open circuit voltage value at a residual quantity rate value with respect to each of a plurality of residual quantity rate values at which the residual quantities against a full capacity of the secondary battery are given at intervals of a predetermined value;
    correct the residual quantity rate value in a way that reduces the residual quantity rate value corresponding to the maximum discharge current value stored in the storage, wherein the residual quantity rate value is corrected on the basis of the residual quantity rate value associated with a voltage value obtained by doing an arithmetic operation about the maximum discharge current value, the predetermined internal resistance value of the secondary battery and a discharge cutoff voltage value;
    update the residual quantity rate value with the corrected residual quantity rate value; and
    display the residual quantity rate value such that the residual quantity rate value is reduced comparatively quickly in a high current discharge state of the maximum discharge current value and the residual quantity rate value is reduced comparatively slowly in a low current discharge state of the maximum discharge current value.

2. The non-transitory computer readable recording medium recorded with the residual quantity display program according to claim 1, wherein the residual quantity rate value is corrected by subtracting a residual quantity rate value associated with the voltage value obtained by the arithmetic operation from the residual quantity rate value and by multiplying a value obtained by the subtraction by an inverse number of the value obtained in a manner that subtracts the residual quantity rate value associated with the open circuit voltage value from "1".

3. The non-transitory computer readable recording medium recorded with the residual quantity display program according to claim 1, wherein the open circuit voltage value is calculated by adding the discharge cutoff voltage value to a value obtained by multiplying the maximum discharge current value by the predetermined internal resistance value of the secondary battery.

4. The non-transitory computer readable recording medium recorded with the residual quantity display program according to claim 1, wherein the maximum discharge current value is sent to an initial value when the secondary battery is attached.

5. The non-transitory computer readable recording medium recorded with the residual quantity display program according to claim 1, wherein the hardware processor stops the secondary battery from discharging when the discharge voltage value falls below the discharge cutoff voltage value.

6. The non-transitory computer readable recording medium recorded with the residual quantity display program according to claim 1, wherein the high current discharge state of the maximum discharge current value is 4.0 A and the low current discharge state of the maximum discharge current value is 2.0 A.

7. A residual quantity display device comprising:
    a memory; and
    a hardware processor coupled to the memory and configured to:
    store an initial value of a maximum discharge current value in a storage when a secondary battery is attached;
    acquire a discharge current value of the secondary battery using a current sensor;
    determine whether the discharge current value exceeds the initial value of the maximum discharge current value;
    overwrite the initial value of the maximum discharge current value stored in the storage with the discharge current value when the discharge current value exceeds the maximum discharge current value in a discharge process of the secondary battery, wherein the maximum discharge current value stored in the storage is a maximum discharge current value in a discharge process from when the secondary battery is attached;

acquire a discharge voltage value of the secondary battery using a voltage sensor;

read a residual quantity rate value associated with an open circuit voltage value, wherein the open circuit voltage value is arithmetically obtained from the discharge voltage value, the discharge current value, and a predetermined internal resistance value of the secondary battery, and wherein the residual quantity rate value is read out of a table that defines an open circuit voltage value at a residual quantity rate value with respect to each of a plurality of residual quantity rate values at which the residual quantities against a full capacity of the secondary battery are given at intervals of a predetermined value;

correct the residual quantity rate value in a way that reduces the residual quantity rate value corresponding to the maximum discharge current value stored in the storage, wherein the residual quantity rate value is corrected on the basis of the residual quantity rate value associated with a voltage value obtained by doing an arithmetic operation about the maximum discharge current value, the predetermined internal resistance value of the secondary battery and a discharge cutoff voltage value;

update the residual quantity rate value with the corrected residual quantity rate value; and display the residual quantity rate value such that the residual quantity rate value is reduced comparatively quickly in a high current discharge state of the maximum discharge current value and the residual quantity rate value is reduced comparatively slowly in a low current discharge state of the maximum discharge current value.

8. The residual quantity display device according to claim 7, wherein the residual quantity rate value is corrected by subtracting a residual quantity rate value associated with the voltage value obtained by the arithmetic operation from the residual quantity rate value and by multiplying a value obtained by the subtraction by an inverse number of the value obtained in a manner that subtracts the residual quantity rate value associated with the open circuit voltage value from "1".

9. The residual quantity display device according to claim 7, wherein the open circuit voltage value is calculated by adding the discharge cutoff voltage value to a value obtained by multiplying the maximum discharge current value by the predetermined internal resistance value of the secondary battery.

10. The residual quantity display device according to claim 7, wherein the maximum discharge current value is set to an initial value when the secondary battery is attached.

11. The residual quantity display device according to claim 7, wherein the hardware processor stops the secondary battery from discharging when the discharge voltage value falls below the discharge cutoff voltage value.

12. The residual quantity display device according to claim 7, wherein the high current discharge state of the maximum discharge current value is 4.0 A and the low current discharge state of the maximum discharge current value is 2.0 A.

13. An electronic device comprising:

a secondary battery;

a load to operate by electric power supplied from the secondary battery;

a memory;

a hardware processor coupled to the memory and configured to:

store an initial value of a maximum discharge current value in a storage when the secondary battery is attached;

acquire a discharge current value of the secondary battery using a current sensor;

determine whether the discharge current value exceeds the initial value of the maximum discharge current value;

overwrite the initial value of the maximum discharge current value stored in the storage with the discharge current value when the discharge current value exceeds the maximum discharge current value in a discharge process of the secondary battery, wherein the maximum discharge current value stored in the storage is a maximum discharge current value in a discharge process from when the secondary battery is attached;

acquire a discharge voltage value of the secondary battery using a voltage sensor;

read a residual quantity rate value associated with an open circuit voltage value, wherein the open circuit voltage value is arithmetically obtained from the discharge voltage value, the discharge current value, and a predetermined internal resistance value of the secondary battery, and wherein the residual quantity rate value is read out of a table that defines an open circuit voltage value at a residual quantity rate value with respect to each of a plurality of residual quantity rate values at which the residual quantities against a full capacity of the secondary battery are given at intervals of a predetermined value;

correct the residual quantity rate value in a way that reduces the residual quantity rate value corresponding to the maximum discharge current value stored in the storage, wherein the residual quantity rate value is corrected on the basis of the residual quantity rate value associated with a voltage value obtained by doing an arithmetic operation about the maximum discharge current value, the predetermined internal resistance value of the secondary battery and a discharge cutoff voltage value;

update the residual quantity rate value with the corrected residual quantity rate value; and display the residual quantity rate value such that the residual quantity rate value is reduced comparatively quickly in a high current discharge state of the maximum discharge current value and the residual quantity rate value is reduced comparatively slowly in a low current discharge state of the maximum discharge current value.

14. The electronic device according to claim 13, wherein the residual quantity rate value is corrected by subtracting a residual quantity rate value associated with the voltage value obtained by the arithmetic operation from the residual quantity rate value and by multiplying a value obtained by the subtraction by an inverse number of the value obtained in a manner that subtracts the residual quantity rate value associated with the open circuit voltage value from "1".

15. The electronic device according to claim 13, wherein the open circuit voltage value is calculated by adding the discharge cutoff voltage value to a value obtained by multiplying the maximum discharge current value by the predetermined internal resistance value of the secondary battery.

16. The electronic device according to claim 13, wherein the maximum discharge current value is set to an initial value when the secondary battery is attached.

17. The electronic device according to claim 13, wherein the hardware processor stops the secondary battery from discharging when the discharge voltage value falls below the discharge cutoff voltage value.

18. The electronic device according to claim 13, wherein the high current discharge state of the maximum discharge current value is 4.0 A and the low current discharge state of the maximum discharge current value is 2.0 A.

* * * * *